US008189359B2

(12) United States Patent
Lee

(10) Patent No.: US 8,189,359 B2
(45) Date of Patent: May 29, 2012

(54) NONVOLATILE MEMORY DEVICE HAVING DIFFERENT TYPES OF METAL LINES

(75) Inventor: Doosub Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 288 days.

(21) Appl. No.: 12/718,067

(22) Filed: Mar. 5, 2010

(65) Prior Publication Data

US 2010/0254190 A1    Oct. 7, 2010

(30) Foreign Application Priority Data

Apr. 3, 2009   (KR) .................. 10-2009-0029046

(51) Int. Cl.
*G11C 5/06* (2006.01)
(52) U.S. Cl. ............................ 365/63; 365/51
(58) Field of Classification Search .................. 365/63, 365/51, 230.03
See application file for complete search history.

(56) References Cited

U.S. PATENT DOCUMENTS

| | | | |
|---|---|---|---|
| 6,034,879 A * | 3/2000 | Min et al. ............... | 365/63 |
| 6,731,539 B1 * | 5/2004 | Wong ............... | 365/185.11 |
| 7,184,307 B2 | 2/2007 | Lee | |
| 7,376,017 B2 | 5/2008 | Kim | |
| 2008/0198663 A1 | 8/2008 | Kim | |
| 2009/0073760 A1 * | 3/2009 | Betser et al. ............... | 365/185.2 |

FOREIGN PATENT DOCUMENTS

| | | |
|---|---|---|
| JP | 2004319070 | 11/2004 |
| JP | 2006313613 | 11/2006 |
| KR | 1020040090841 A | 10/2004 |
| KR | 1020040093299 A | 11/2004 |
| KR | 1020060114736 A | 11/2006 |

* cited by examiner

*Primary Examiner* — Vu Le

(74) *Attorney, Agent, or Firm* — Volentine & Whitt, PLLC

(57) ABSTRACT

Provided is a nonvolatile memory device, including a memory cell array region, a decoder and an interface region. The memory cell array region includes multiple word lines. The decoder supplies multiple voltages to the word lines through multiple first type metal lines formed of a first metal and multiple second type metal lines formed of a second metal. The interface region connects the first type metal lines to first word lines in a first group, and connects the second type metal lines to second word lines in a second group. The first type metal lines are sequentially disposed to correspond with a positioning order of the first word lines in the first group, and the second type metal lines are sequentially disposed to correspond with a positioning order of the second word lines in the second group.

10 Claims, 13 Drawing Sheets

NONVOLATILE MEMORY DEVICE HAVING DIFFERENT TYPES OF METAL LINES

CROSS-REFERENCE TO RELATED APPLICATIONS

A claim of priority is made under 35 U.S.C. §119 to Korean Patent Application No. 10-2009-0029046, filed on Apr. 3, 2009, in the Korean Intellectual Property Office, the subject matter of which is hereby incorporated by reference

BACKGROUND

The present disclosure relates to a semiconductor memory device, and more particularly, to the wiring structure of a nonvolatile memory device.

A semiconductor memory device may be a volatile semiconductor memory device or a nonvolatile semiconductor memory device.

Although the read and write speeds of a volatile semiconductor memory device are fast, data that are stored in the volatile semiconductor memory device are erased when an external power supply source is shut off. On the other hand, even when an external power supply source is shut off, the nonvolatile semiconductor memory device retains stored data. Therefore, the nonvolatile semiconductor memory device is used to store data to be retained irrespective of whether the external power supply source is on or off. Examples of nonvolatile semiconductor memory devices include Mask Read-Only Memory (MROM), Programmable Read-Only Memory (PROM), Erasable Programmable Read-Only Memory (EPROM) and Electrically Erasable Programmable Read-Only Memory (EEPROM).

In MROM, PROM and EPROM, generally, it is difficult to update stored data because it is inconvenient to autonomously erase and write data. In comparison, EEPROM may electrically erase and write data, so uses of EEPROM for system programming and auxiliary memory devices which require continuous updates are being expanded. Also, flash EEPROM in particular has a higher degree of integration than the existing EEPROM, and is therefore easily incorporated as large-capacity auxiliary memory devices. Flash EEPROM includes NAND-type flash EEPROM (hereinafter referred to as a NAND-type flash memory), for example, which has a higher degree of integration than other types of flash EEPROM.

SUMMARY

Embodiments of the inventive concept provide a nonvolatile memory device, including a memory cell array region, a decoder and an interface region. The memory cell array region includes multiple word lines. The decoder supplies multiple voltages to the word lines through multiple first type metal lines formed of a first metal and multiple second type metal lines formed of a second metal. The interface region connects the first type metal lines to first word lines in a first group, and connects the second type metal lines to second word lines in a second group. The first type metal lines are sequentially disposed to correspond with a positioning order of the first word lines in the first group, and the second type metal lines are sequentially disposed to correspond with a positioning order of the second word lines in the second group. The nonvolatile memory device may thus have a wiring structure independent of a breakdown voltage.

In various embodiments, the decoder may be disposed at one side of the memory cell array.

In various embodiments, the first type metal lines may be disposed to minimize a difference between voltages applied to adjacent word lines among the first word lines in the first group. Also, the second type metal lines may be disposed to minimize a difference between voltages applied to adjacent word lines among the second word lines in the second group.

In various embodiments, the first word lines in the first group and the second word lines in the second group may be sequentially disposed, respectively.

In various embodiments, the first type metal lines and the second type metal lines may be formed at different layers.

In various embodiments, the number or separation distance of the first type metal lines and the number or separation distance of the second type metal lines may be determined according to the physical characteristics of the first metal and second metal, respectively.

In various embodiments, the number of the first type metal lines may differ from the number of the second type metal lines.

In various embodiments, each of the first type metal lines may be disposed at an upper portion of a first inter-layer dielectric, and connected to a corresponding first word line through a contact point formed through the first inter-layer dielectric.

In various embodiments, each of the second type metal lines may be disposed at an upper portion of a second inter-layer dielectric, and connected to a corresponding middle metal line through a via formed through the second inter-layer dielectric. Also, the middle metal line may be connected to a corresponding second word line through a contact point.

In various embodiments, the middle metal line may be formed of the first metal at the upper portion of the first inter-layer dielectric.

BRIEF DESCRIPTION OF THE DRAWINGS

The accompanying drawings are included to provide further understanding of the inventive concept, and are incorporated in and constitute a part of this specification. Exemplary embodiments of the inventive concept will be described with reference to the attached drawings, including.

DETAILED DESCRIPTION OF THE EMBODIMENTS

Figure 1:
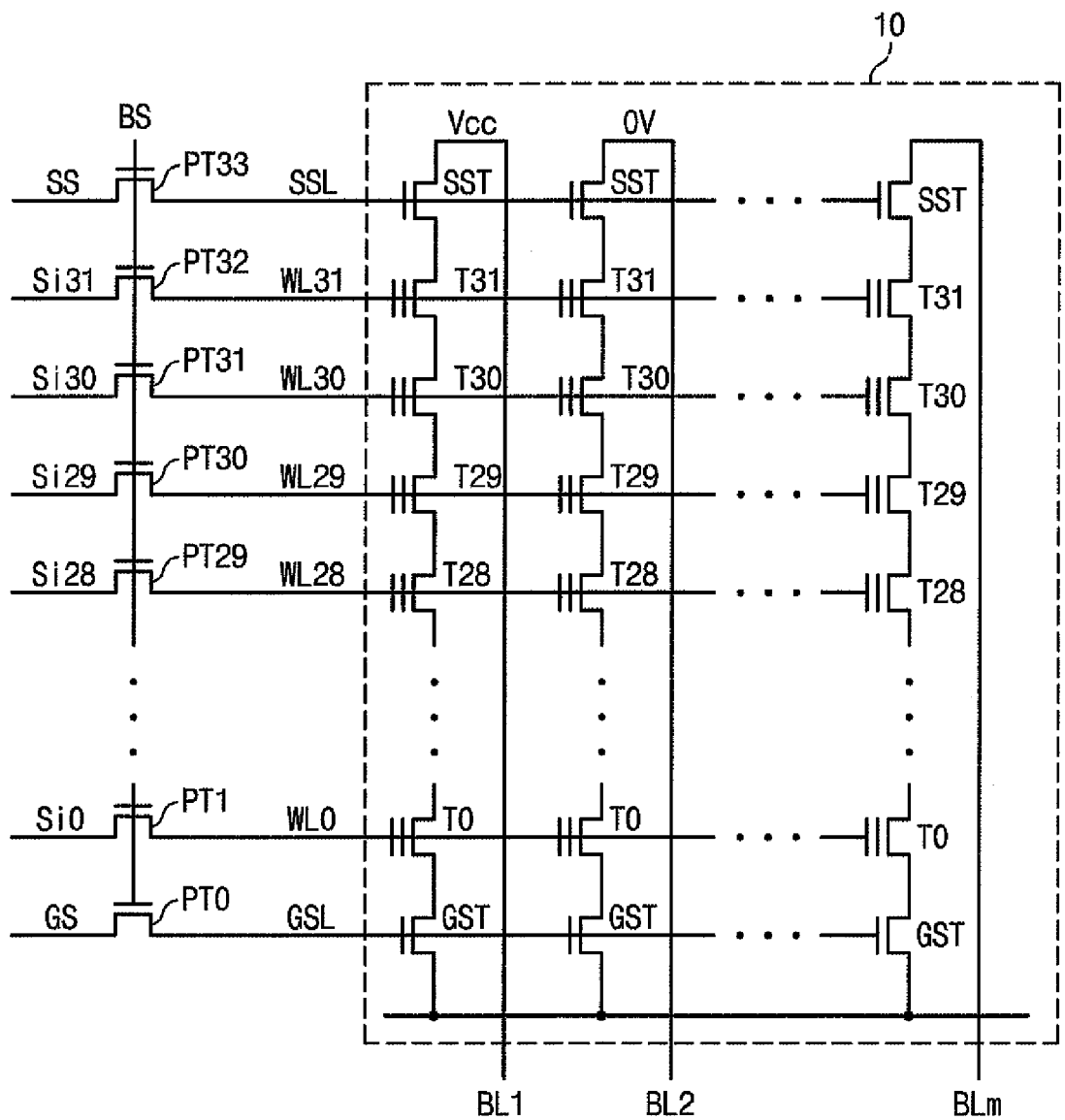
FIG. 1 is a circuit diagram illustrating the structure of a cell array in a flash memory device, according to an exemplary embodiment of the inventive concept.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Further, the circuit configurations of nonvolatile memory devices are provided as examples, and the corresponding characteristics may be applied to various types of nonvolatile memories, such as flash memory, MRAM and PRAM. Throughout the drawings and written description, like reference numerals will be used to refer to like or similar elements.

A nonvolatile memory device according to exemplary embodiments of the inventive concept may include metal lines connected between word lines and a row decoder, in consideration of differences between voltages applied to the word lines in a programming operation. The nonvolatile memory device may include a structure sequentially disposing the contact of a gate poly, so that the voltage difference between adjacent metal lines decreases, in consideration of a wiring layer at which the metal lines are wired. Accordingly, even when the distance between the metal lines is decreased by design, the amount of a leakage current that occurs between the adjacent metal lines can be reduced and the distance between the metal lines can be effectively narrowed independent of the level of a breakdown voltage.

FIG. 1 is a circuit diagram illustrating the structure of a memory cell array 10 in a flash memory device 20, according to an exemplary embodiment.

The flash memory device 20, which may be a flash EEPROM, for example, includes the memory cell array 10. The memory cell array 10 is configured with multiple floating gate transistors and multiple memory blocks. Bit BL1 to BLm are disposed in parallel in the memory blocks. Each of the memory blocks includes multiple strings (e.g., referred to as NAND string) corresponding to the bit lines BL1 to BLm. FIG. 1 illustrates a configuration of the strings included in one representative memory block.

Referring to FIG. 1, each of the strings includes a string selection transistor SST, a ground selection transistor GST, and multiple (for example, 32) memory cells or floating gate transistors T0 to T31 that are serially connected between the source of the string selection transistor SST and the drain of the ground selection transistor GST. The drain of the string selection transistor SST included in the each string is connected to a corresponding bit line, and the source of the ground selection transistor GST is connected to a common source line CSL (or a common signal line). The gates of the string selection transistors SST included in each string are connected in common to a string selection line SSL, and the gates of the ground selection transistors GST are connected in common to a ground selection line GSL. The control gates of the floating gate transistors T0 to T31 included in the each string are connected in common to corresponding word lines WL0 to WL31. Each of the bit lines BL1 to BLm is electrically connected to a page buffer circuit (not shown) of the flash memory device 20.

The ground selection line GSL, the word lines WL0 to WL31 and the string selection line SSL are connected to corresponding selection signal lines GS, Si0 to Si31 and SS through corresponding transistors PT0 to PT33, respectively. The transistors PT0 to PT33 may operate as row decoder pass transistors included in a row decoder (not shown) of the flash memory device 20. The transistors PT0 to PT33 are controlled in common by a block selection control signal BS. The selection signal lines GS, Si0 to Si31 and SS are respectively driven by corresponding selection circuits (or driving circuits) when a programming operation is performed. The block selection control signal BS has a high voltage level, and allows a programming voltage or a pass voltage (which is applied through the selection signal lines Si0 to Si31) to be transferred to the corresponding word lines WL0 to WL31.

The word lines WL0 to WL31 and the transistors PT0 to PT33 of the row decoder are connected through metal lines, discussed below. Generally, as flash memory becomes more highly integrated, the distance between adjacent word lines (e.g., word lines WL0 to WL31) decreases, while the voltage level applied to the word lines and the corresponding metal lines does not decrease, despite the decreased distance. Accordingly, as the flash memories become more highly integrated, leakage current between the metal lines increases. Also, as the relative voltage difference between adjacent metal lines increases, the amount of the leakage current increases. That is, when the same voltage is applied, the amount of the leakage current increases as the distance between adjacent metal lines is narrowed. Furthermore, the amount of leakage current that occurs may vary according to the kind of metal used in the metal lines. For example, when the metal lines are formed of copper, the amount of a leakage current caused by voltage difference between adjacent metal lines is greater than when the metal lines are formed of tungsten. Therefore, when the same voltage difference is provided between adjacent metal lines, the distance between metal lines formed of copper must be greater than the distance between metal lines formed of tungsten.

In a highly-integrated flash memory device, dividing a row decoder into at least two circuits and respectively disposing the two circuits at both sides of the memory cell array 10 is used for broadly securing the distance between the metal lines. However, because at least two row decoder circuits are included for one memory cell array 10, more chip space is required.

To prevent this limitation, in exemplary embodiments of the inventive concept, one row decoder is disposed at one side of the memory cell array 10. Furthermore, metal lines for connecting the row decoder with respective word lines may be disposed in at least two layers, and the distance between the metal lines that are respectively disposed in the layers is narrowed as much as possible. In an exemplary embodiment, the distance between the metal lines respectively disposed in the layers may be determined in consideration of the difference between voltages that are applied to the word lines in a programming operation.

In positioning the metal lines according to an exemplary embodiment of the inventive concept, a method or technique for adjusting the distance between the metal lines is as follows.

Generally, the distance between the metal lines has a close relationship to the level of a breakdown voltage VB. For example, as the distance between the metal lines increases, the level of the breakdown voltage VB that the metal line can endure becomes higher. As the distance between the metal lines decreases, the level of the breakdown voltage VB that the metal line can endure becomes lower. Accordingly, many circuit designers adjust the distance between the metal lines in consideration of the level of the breakdown voltage VB. However, the level of the breakdown voltage VB applied at this point uses a value that is calculated on the basis of the maximum voltage difference (for example, the difference between the maximum programming voltage and a ground voltage) that may occur between the metal lines. In this case, because the maximum voltage difference (for example, the difference the between the maximum programming voltage and a ground voltage) that may occur between the metal lines has a large value, e.g., higher than 24V, the extent to which the distance between the metal lines can be narrowed is limited.

Accordingly, various exemplary embodiments of the inventive concept provide a technique for metal line wiring that is independent of the breakdown voltage. For example, in an exemplary embodiment, the metal lines may be positioned to minimize the voltage difference between adjacent metal lines, in consideration of the level of voltage applied to adjacent word lines in a programming operation.

Figure 2:
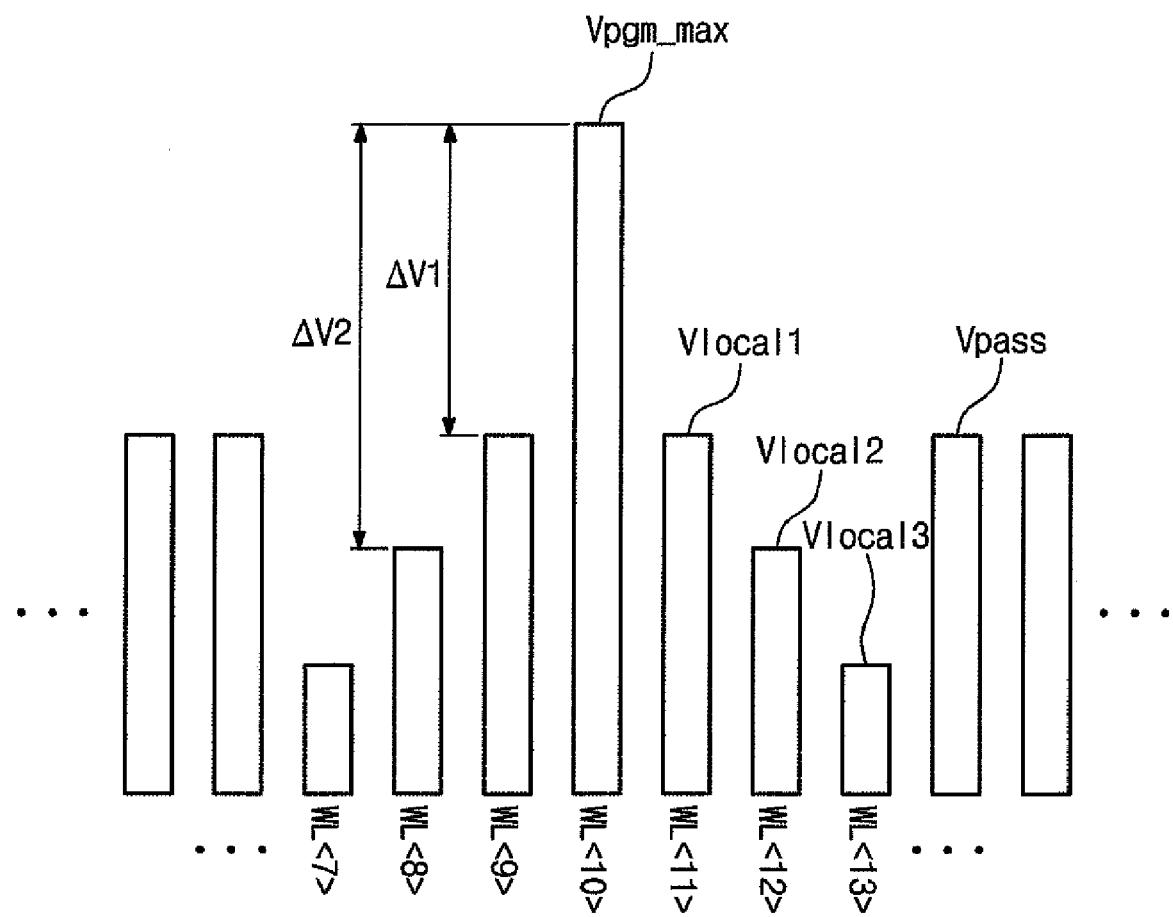
FIG. 2 is a diagram illustrating voltages applied to a memory cell array in FIG. 1 in a programming operation, according to an exemplary embodiment of the inventive concept.

FIG. 2 is a diagram illustrating voltages applied to the memory cell array 10 in FIG. 1 in a programming operation, according to an exemplary embodiment.

Referring to FIG. 2, a programming voltage Vpgm may be applied to a word line (for example, word line WL10) that is selected in a programming operation, and local voltages Vlocal1 to Vlocal3 may be applied to the word lines adjacent to the selected word line (for example, word lines WL7 to WL9 and WL11 to WL13). Furthermore, a pass voltage Vpass may be applied to word lines adjacent to the word lines to which the local voltages are applied. The local voltages Vlocal1, Vlocal2 and Vlocal3 and the pass voltage Vpass are applied to prevent a programming disturb, in which a selected memory cell and adjacent memory cells connected to the same word line are programmed. FIG. 2 illustrates examples of the level of the pass voltage Vpass and the levels of the local voltages Vlocal1, Vlocal2 and Vlocal3, and the positions of the word lines to which the pass voltage Vpass and the local voltages Vlocal1, Vlocal2 and Vlocal3 are applied. In various embodiments and configurations, the timing according to which the pass voltage Vpass and the local voltages Vlocal1, Vlocal2 and Vlocal3 are applied, the voltage levels, and the positions of corresponding word lines to which the pass voltage Vpass and the local voltages Vlocal1, Vlocal2 and Vlocal3 are applied may vary.

The programming voltage Vpgm is applied to a word line selected for programming, and has a high voltage level of about 20V, for example. The programming voltage Vpgm may incrementally increase from the minimum programming voltage to the maximum programming voltage Vpgm_max during a repeated programming cycle, according to an Incremental Step Pulse Programming (ISPP) technique. The maximum programming voltage Vpgm_max may have a voltage level of about 24V, for example. The pass voltage Vpass may be applied to at least one word line adjacent to the selected word line.

The pass voltage Vpass has a voltage level that is lower than the programming voltage Vpgm and higher than the local voltages Vlocal1, Vlocal2 and Vlocal3. For example, the pass voltage Vpass may have a voltage level of about 9V. When the pass voltage Vpass is applied to at least two word lines, the pass voltage Vpass may have the same voltage level or different voltage levels.

The local voltages Vlocal1, Vlocal2 and Vlocal3 are used to localize a boosting region in which programming is inhibited. The local voltages Vlocal1, Vlocal2 and Vlocal3 may be applied to at least one word line adjacent to the selected word line. The local voltages Vlocal1, Vlocal2 and Vlocal3 have voltage levels that are less than or equal to the pass voltage Vpass and greater than or equal to a ground voltage (0V). A voltage that is defined at a specific level, such as power supply source voltage Vcc or a read voltage Vread, may be used as the local voltages Vlocal1, Vlocal2 and Vlocal3, although any voltages having various levels that satisfy the above-described ranges may be used as the local voltages Vlocal1, Vlocal2 and Vlocal3. For example, the local voltages Vlocal1, Vlocal2 and Vlocal3 may have an arbitrary voltage level of about 6V instead of a voltage having a defined specific level, like the power supply source voltage Vcc and the read voltage Vread. When the local voltages Vlocal1, Vlocal2 and Vlocal3 are applied to at least two word lines, they may have the same voltage level or different voltage levels.

FIG. 2 depicts a case in which the highest voltage applied in a programming operation is the programming voltage Vpgm, having a maximum programming voltage Vpgm_max of about 24V, for example. Further, FIG. 2 depicts a case in which the voltage difference is the smallest between the selected word line (for example, WL10) to which the programming voltage Vpgm is applied and the adjacent word lines (for example, word lines WL9 and WL11) to which the local voltage Vlocal1 (hereinafter referred to as first local voltage). In other words, the first local voltage Vlocal1 has the highest voltage level, and thus the voltage difference $\Delta V1$ is the smallest shown in FIG. 2. In an embodiment, the first local voltage Vlocal1 may have the same voltage level as that of the pass voltage Vpass. The voltage difference $\Delta V1$ when the first local voltage Vlocal1 is applied to the word lines WL9 and WL11 adjacent to the selected word line WL10 has a value less than a voltage difference $\Delta V2$ if the second local voltage Vlocal2 lower than the first local voltage Vlocal1 were applied to the word lines WL9 and WL11 adjacent to the selected work line WL10. In embodiment, the second local voltage Vlocal2 may be applied to the word lines WL9 and WL11 adjacent to the selected word line WL10, for example, when the physical positions of the metal lines that respectively correspond to the word lines are matched with a word line order. To the contrary, the first local voltage Vlocal1 may be applied to the word lines WL9 and WL11 adjacent to the selected word line WL10, for example, when the physical positions of the metal lines that respectively correspond to the word lines are matched with a word line order. Therefore, in a case where the word lines are sequentially disposed and the metal lines are sequentially disposed to be in correspondence with the order of the word lines that are sequentially disposed, the voltage difference between adjacent word lines (for example, a selected word line and a word line adjacent to it) is least.

In this case, the maximum value of the voltage difference between adjacent metal lines that occurs, for example, does not exceed the range of the difference voltage (i.e., $\Delta V1$) between the maximum programming voltage Vpgm_max and the first local voltage Vlocal1 or the pass voltage Vpass. Thus, a metal line positioning technique according to an exemplary embodiment can further narrow the distance between the metal lines than a metal line positioning technique that simply applies the breakdown voltage VB. For example, when the distance between the metal lines is adjusted with respect to the breakdown voltage VB, the maximum voltage difference that may occur between adjacent metal lines is the difference between the maximum programming voltage Vpgm_max and a ground voltage, and may be equal to or higher than about 24V. However, according to the metal line positioning technique according to an exemplary embodiment of the inventive concept, the maximum voltage difference that may occur between the metal lines corresponds to a case in which the maximum programming voltage Vpgm_max is applied to a selected word line and the first local voltage Vlcoal1 is applied to a word line adjacent to the selected word line, and does not exceed a maximum of about 15V, for example. The decreased voltage difference between adjacent metal lines provides a corresponding decrease of a leakage current. As the leakage current between adjacent metal lines decreases, the distance between adjacent metal lines may be narrowed.

As described above, the metal line positioning technique according to an exemplary embodiment enables the distance between the metal lines to be effectively narrowed, independent of positioning limitations based on the breakdown voltage. As a result, the flash memory device may be more highly integrated.

Figure 3A:
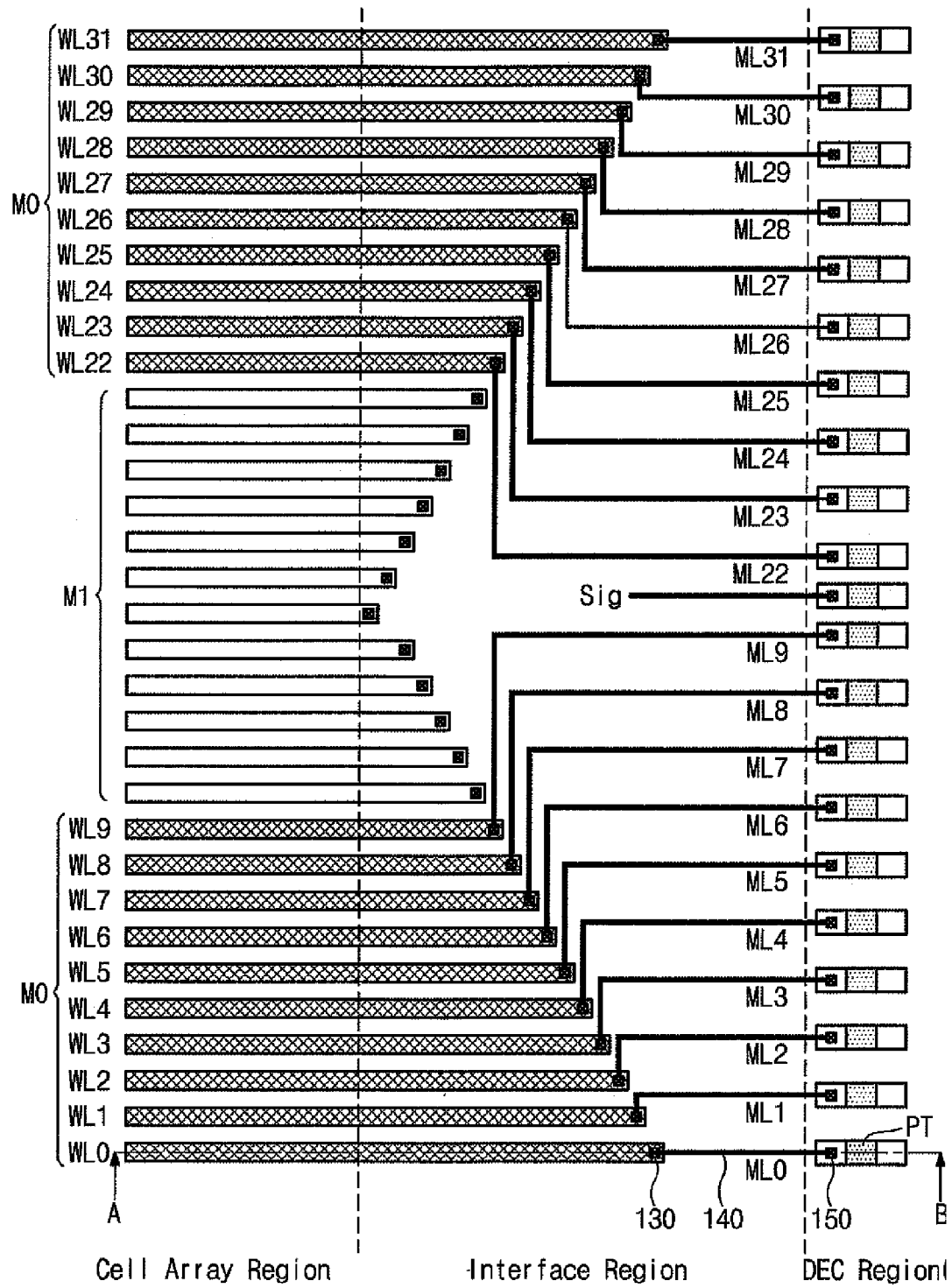
FIGS. 3A and 3B are diagrams illustrating positioning of different type metal lines, according to an exemplary embodiment of the inventive concept.
Figure 3B:
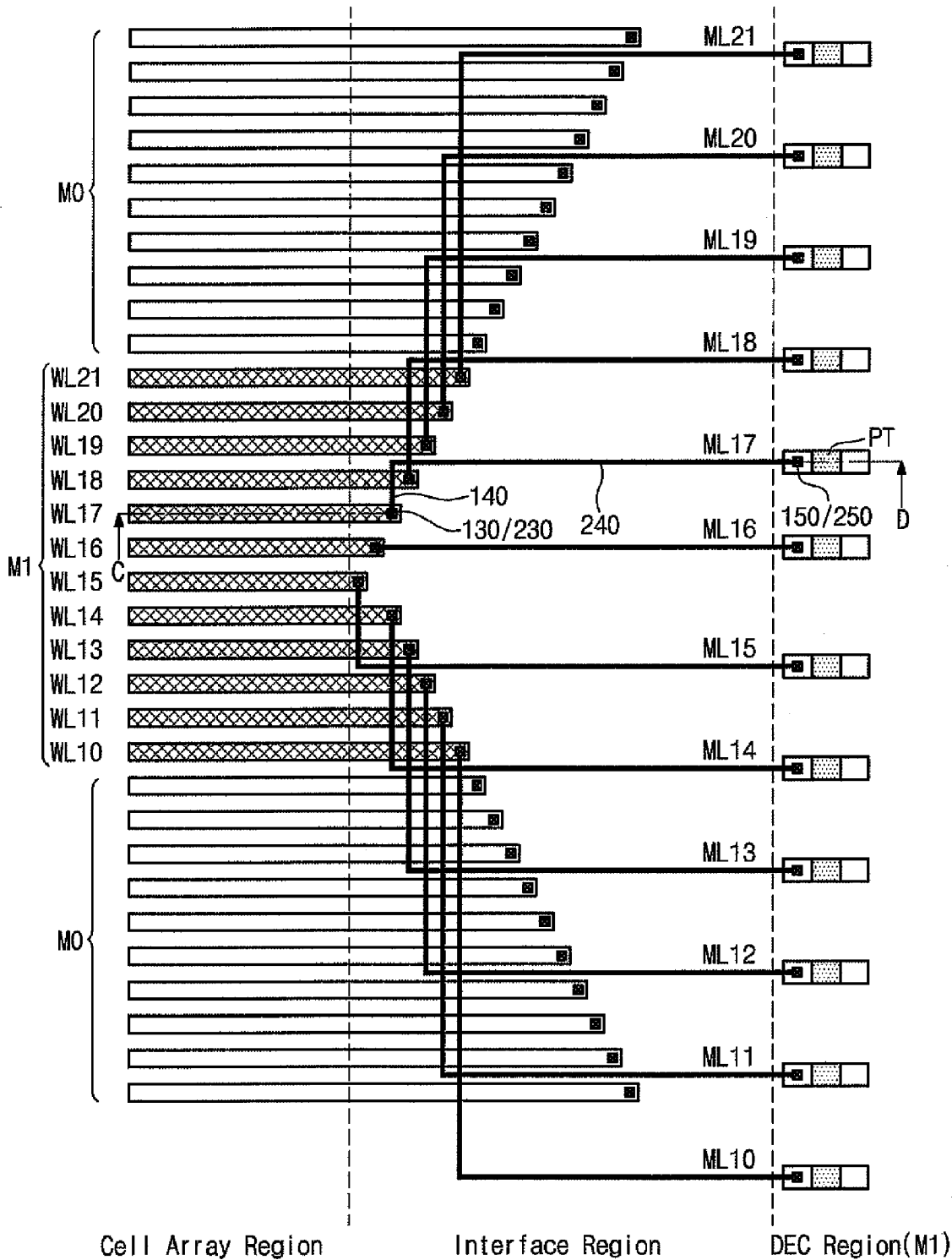

FIGS. 3A and 3B are cross-sectional views illustrating positioning of the metal lines ML0 to ML31, according to an exemplary embodiment. In FIGS. 3A and 3B, connections are illustrated between the word lines WL0 through WL31 (e.g., shown in FIG. 1) and the metal lines ML0 to ML31 for connecting to the row decoder.

In the exemplary embodiment, one row decoder is disposed at one side of the memory cell array 10, and the metal lines ML0 to ML31 for connecting the row decoder and the word lines WL0 to WL31 are wired using two different types of metal on two different layers, as described below. However, the embodiment is an example of the inventive concept, and the number of layers at which the metal lines are formed, the kind of metal and the number of row decoders may be modified in various implementations, without departing from the scope of the present teachings. Also, the memory cell array and the word lines corresponding to the memory cell array may be distributed to and disposed in at least two layers.

Referring to FIGS. 3A and 3B, the word lines WL0 to WL31 are disposed in a memory cell array region, and contact plug 130 (and via 230) of each of the word lines WL0 to WL31 is disposed in an interface region. In FIGS. 3A and 3B, one contact may be formed in each of the word lines WL0 to WL31, but the number and shape of the contact included in each of the word lines WL0 to WL31 may be variously changed and modified. For example, at least two contacts may be included in each of the word lines WL0 to WL31, and the shapes of the contacts may be variously formed. The word lines WL0 to WL31 and the metal lines ML0 to ML31 respectively corresponding to the word lines WL0 to WL31 are wired in the interface region. Each of the word lines WL0 to WL31 are electrically connected to a transistor PT of a corresponding row decoder through a corresponding metal line 140 (metal lines ML0 to ML31) to which it is wired in the interface region, and contact plug 150.

The interface region is formed between the memory cell array (e.g., cell array region) and the row decoder (e.g., DEC region). The metal lines ML0 to ML31 may be categorized as first type metal lines M0 and second type metal lines M1, according to the kinds of metals from which the metal lines ML0 to ML31 are formed: The first type metal lines M0 and the second type metal lines M1 may be formed at different layers with different metals. In FIG. 3A, the positioning and connections of the first type metal lines M0 are illustrated. In FIG. 3B, the positioning and connections of the second type metal lines M1 are illustrated.

The word lines WL0 to WL31 are divided into a first group and a second group, according to whether the metal lines ML0 to ML31 respectively connected to the word lines WL0 to WL31 are first type metal lines M0 or second type metal lines M1. For example, the word lines connected to the first type metal lines M0, indicated by ML0 to ML9 and ML22 to ML31, may be the first group. In this case, the word lines of the first group include the word lines WL0 to WL9 and WL22 to WL31. The word lines connected to the second type metal lines M1, indicated by ML10 to ML21, may be the second group. In this case, the word lines of the second group include the word lines WL10 to WL21.

Because the first type metal lines M0 and the second type metal lines M1 have different physical characteristics, the wiring distances between the first type metal lines M0 and the second type metal lines M1 may differ. For example, when the same voltage difference is provided between adjacent metal lines, a leakage current that occurs between the second type metal lines M1 may differ from a leakage current that occurs between the first type metal lines M0. Therefore, in an exemplary embodiment, the distance between the second type metal lines M1 and the distance between the first type metal lines M0 are different, to account for the physical characteristics of the metal lines. For this, in an exemplary embodiment of the inventive concept, the numbers of metal lines disposed in the same area may differ, as well. For example, as illustrated in FIG. 3A, the areas containing the first type metal lines M0 may be configured with twenty metal lines, metal lines ML0 to ML9 and ML22 to ML31. The metal lines ML0 to ML9 and ML22 to ML31 included among the first type metal lines M0 may be disposed at constant distances in the same layer. In this case, a signal line Sig may be wired between the metal lines ML0 to ML9 and the metal lines ML22 and ML31 (i.e., between the metal line ML9 and the metal line ML22). The areas containing the second type metal lines ML1, as illustrated in FIG. 3B, may be configured with twelve metal lines, metal lines ML10 to ML21. The metal lines ML10 to ML21 included among the second type metal lines M1 may also be disposed at constant distances in the same layer.

The flash memory device according to an exemplary embodiment of the inventive concept sequentially positions corresponding word lines in consideration of the difference between voltages that are applied to adjacent word lines in a programming operation, and sequentially positions metal lines to be in correspondence with the order of word lines that are sequentially disposed. Accordingly, the amount of a leakage current that is caused by voltage difference between adjacent word lines decreases, and thus the distance between the adjacent word lines is further narrowed.

Figure 4A:
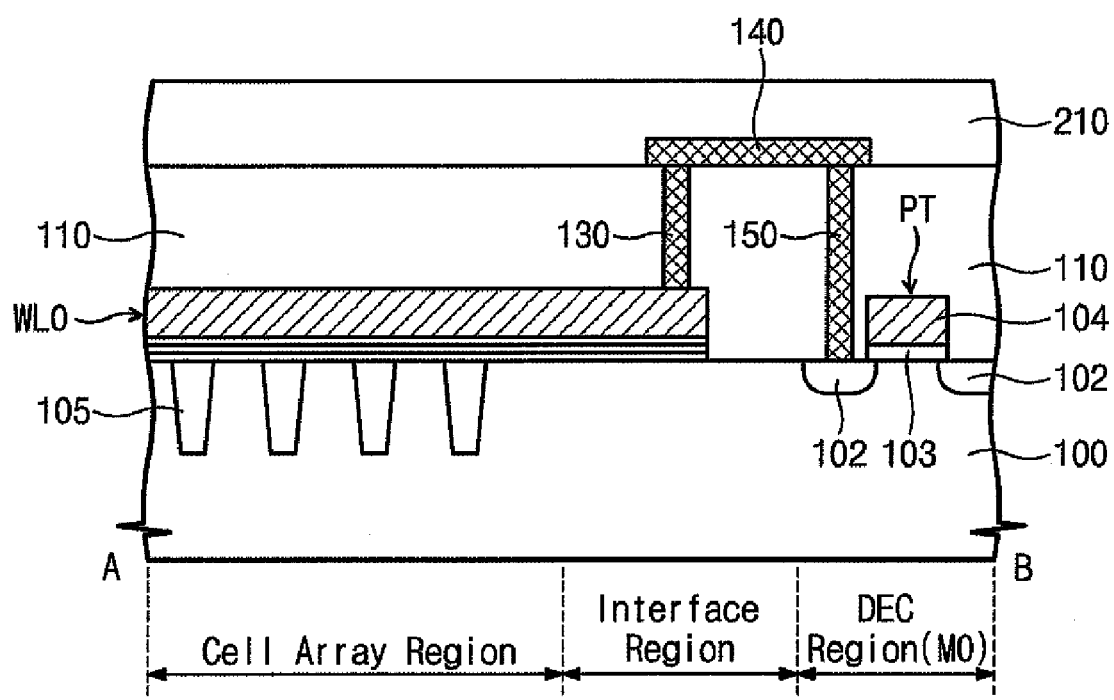
FIGS. 4A and 4B are vertical cross-sectional views illustrating a flash memory device in FIGS. 3A and 3B.
Figure 4B:
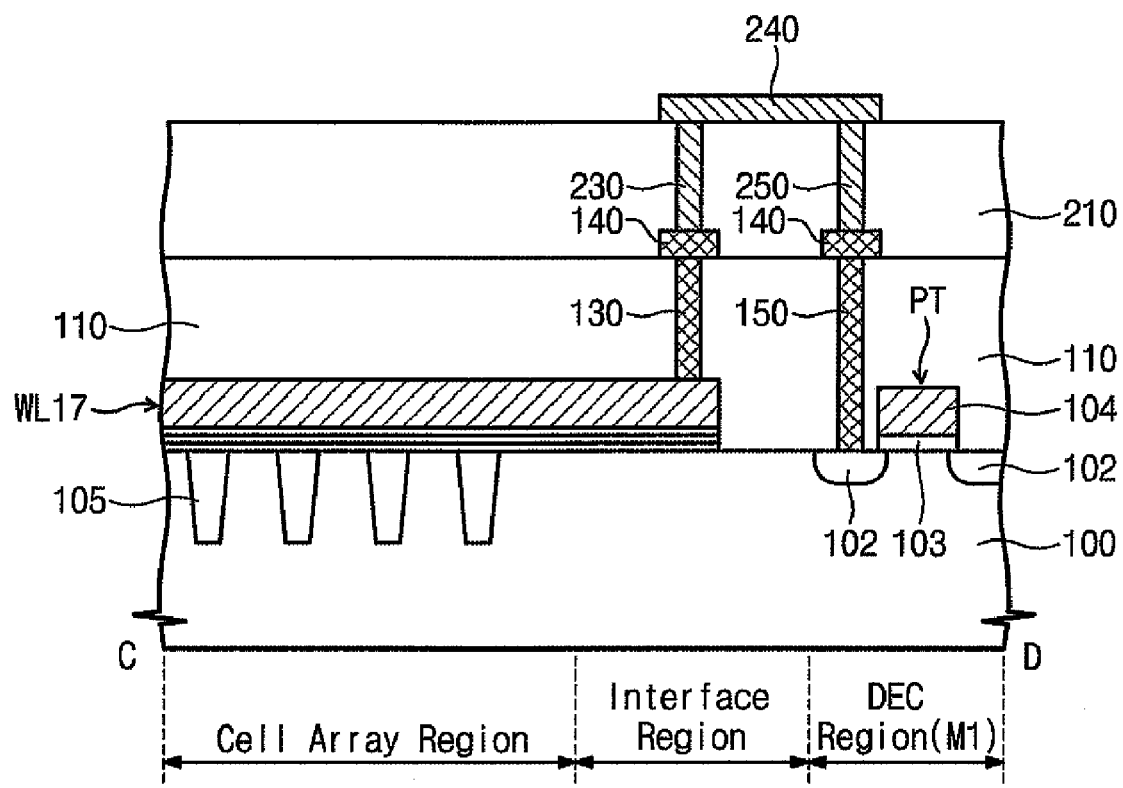

FIGS. 4A and 4B are vertical cross-sectional views illustrating the flash memory device in FIGS. 3A and 3B.

FIG. 4A is a vertical cross-sectional view illustrating a memory device corresponding to line A-B of FIG. 3A, and illustrates an example of a first type metal line M0. FIG. 4B is a vertical cross-sectional view illustrating a memory device corresponding to line C-D of FIG. 3B, and illustrates an example of a second type metal line M1. In FIGS. 4A and 4B, elements other than the elements of the first type metal line M0 and the second type metal line M1 are the substantially same. Accordingly, the same reference numerals are given to the same elements, and repetitive description will not be repeated.

Referring to FIG. 4A, a semiconductor substrate 100 includes a memory cell array region, an interface region and a row decoder region. Multiple isolation layers 105 for defining an active region may be in the memory cell array region of the semiconductor substrate 100. The word line WL0, which may be polysilicon, for example, is formed at the upper portions of the isolation layers 105. The word line WL0 may include a tunnel dielectric layer, a charge trapping layer, a dielectric layer and a gate electrode, for example, which are at the upper portion of the semiconductor substrate 100.

In the depicted embodiment, source/drain regions 102 are provided in the row decoder region of the semiconductor substrate 100. The gate dielectric 103 and the gate electrode 104 of the transistor PT of the row decoder is formed between the source/drain regions 102.

Figure 6:
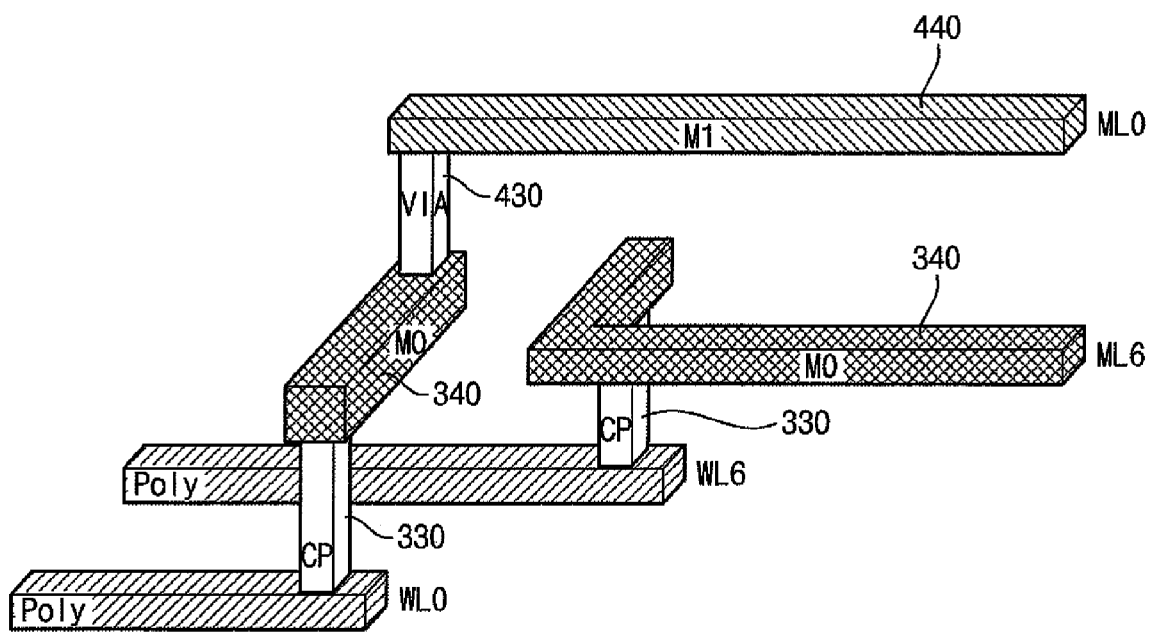
FIG. 6 is a diagram three-dimensionally illustrating the configuration of word lines and corresponding metal lines in FIGS. 5A and 5B.

A first inter-layer dielectric 110 is provided at the upper portion of the semiconductor substrate 100 in which the word line WL0 and the gate electrode 104 are formed. Contact plugs 130 and 150 are formed though the first inter-layer dielectric 110. The first type metal line M0 (for example, ML0) may be formed at the upper portion of the first inter-layer dielectric 110 in the interface region and the row decoder region. A second inter-layer dielectric 210 may be formed at the upper portion of the first inter-layer dielectric 110 in which the first type metal line M0 is formed. In FIG. 4A, the first type metal line M0 is indicated by reference numeral 140. The first type metal line M0 may be disposed in one direction at the upper portion of the first inter-layer dielectric 110, and as illustrated in FIG. 6, the first type metal line M0 may be shaped such that it is bent from one direction to another direction. The first type metal line M0 may be connected to the contact plugs 130 and 150 at certain positions, and thereby connects the corresponding word line WL0 and the transistor PT in a corresponding row decoder. Moreover, the first type metal line M0 may be connected to a second type metal line M1 through a via (not shown in FIG. 4A), which is formed through the second inter-layer dielectric 210, and thus may be used as a middle metal line that connects the second type metal line M1 and the contact plugs 130 and 150 formed through the first inter-layer dielectric 110. A case in which the first type metal line M0 is used as a middle metal line is illustrated in FIGS. 4B and 6, discussed below.

Referring to FIG. 4B, middle metal line 140, formed of the same metal as the first type metal line M0, is formed at the upper portion of the first inter-layer dielectric 110. The second type metal line M1 (for example, ML17) is formed at the upper portion of the second inter-layer dielectric 210, indicated by reference numeral 240 in FIG. 4B. The contact plugs 130 and 150 are formed though the first inter-layer dielectric 110. Vias 230 and 250 are formed through the second inter-layer dielectric 210. The word line WL0 and the first type metal line M0 (for example, ML0) shown in FIG. 4A may be interconnected through the contact plugs 130 and 150 passing through the first inter-layer dielectric 110, the middle metal line 140 and the vias 230 and 250 passing through the second inter-layer dielectric 210. The middle metal line 140 may be wired at the upper portion of the first inter-layer dielectric 110 in the same direction as that of the second type metal line M1 (for example, ML16), or may be wired at the upper portion of the first inter-layer dielectric 110 in a direction different (for example, perpendicular direction) from that of the second type metal line M1 (for example, ML17). The configuration of the middle metal line 140 will be described below in detail with reference to FIG. 6. The positioning and shapes of the contact plugs 130 and 150 and the vias 230 and 250 in FIG. 4B are merely an exemplary embodiment of the inventive concept, and may be variously changed and modified. For example, a position in which the contact plugs 130 and 150 pass through the first inter-layer dielectric 110 may be matched with a position in which the vias 230 and 250 pass through the second inter-layer dielectric 210 in vertical direction. Alternatively, the position in which the contact plugs 130 and 150 pass through the first inter-layer dielectric 110 and the position in which the vias 230 and 250 pass through the second inter-layer dielectric 210 may not be matched with each other, and may be crossed.

As described above, in the flash memory device according to an exemplary embodiment of the inventive concept, one row decoder may be disposed at one side of the memory cell array 10. The metal lines for connecting the row decoder and the word lines may be distributed and disposed in at least two layers. According to this configuration, the area that the metal lines occupy on a chip decreases, and thus the distance between the metal lines can be easily adjusted. More particularly, the number of metal lines to be disposed in each layer may be determined in consideration of the physical characteristic of metal that forms the metal lines, and the metal lines are sequentially disposed to be matched with the order of the word lines that respectively correspond to them. According to this configuration, voltage differences between adjacent word lines and adjacent metal lines decrease, and the distance between the metal lines of the nonvolatile memory device can be effectively narrowed, independent of the level of a breakdown voltage.

Figure 5A:
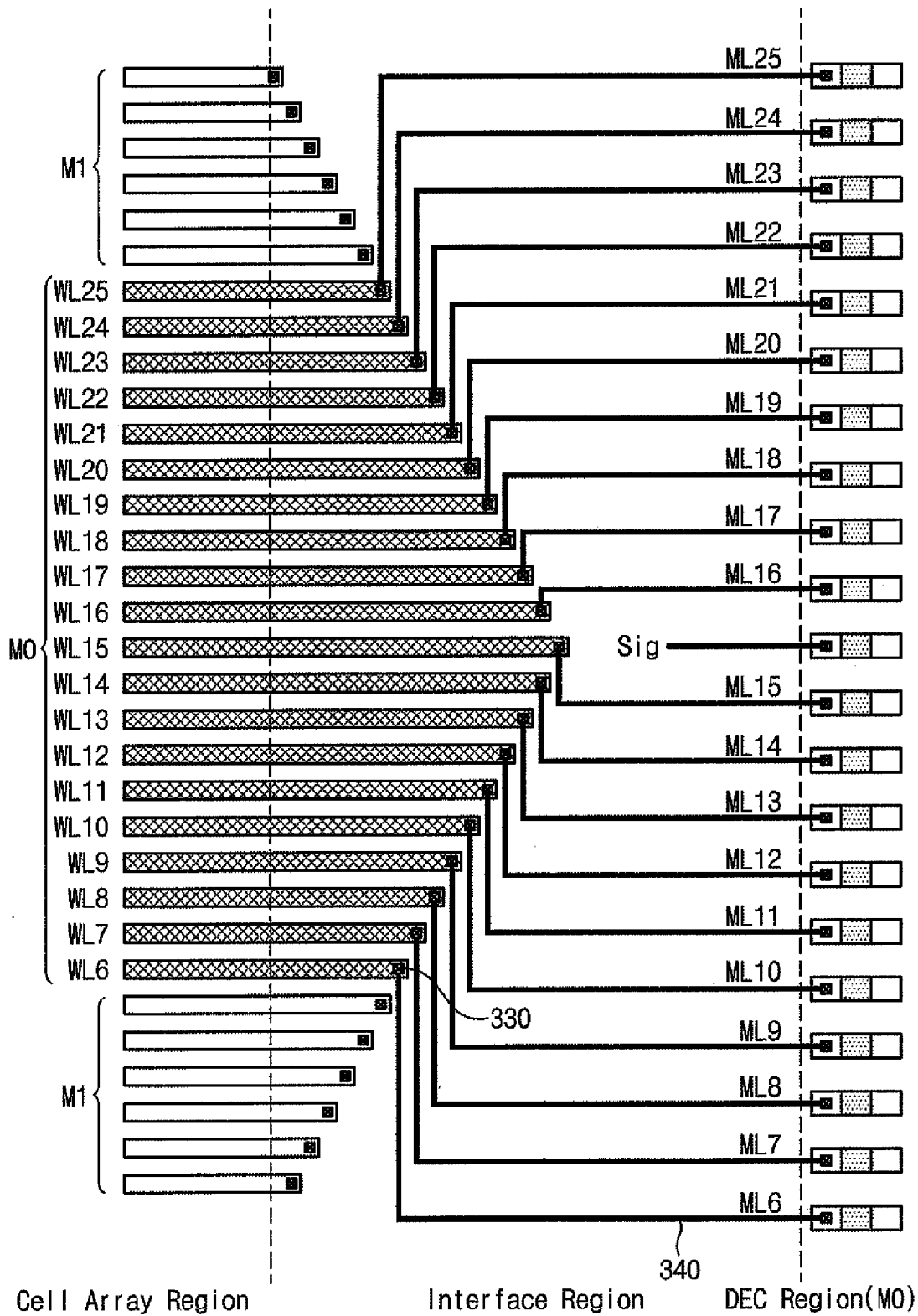
FIGS. 5A and 5B are diagrams illustrating positioning of different type metal lines, according to another exemplary embodiment of the inventive concept.
Figure 5B:
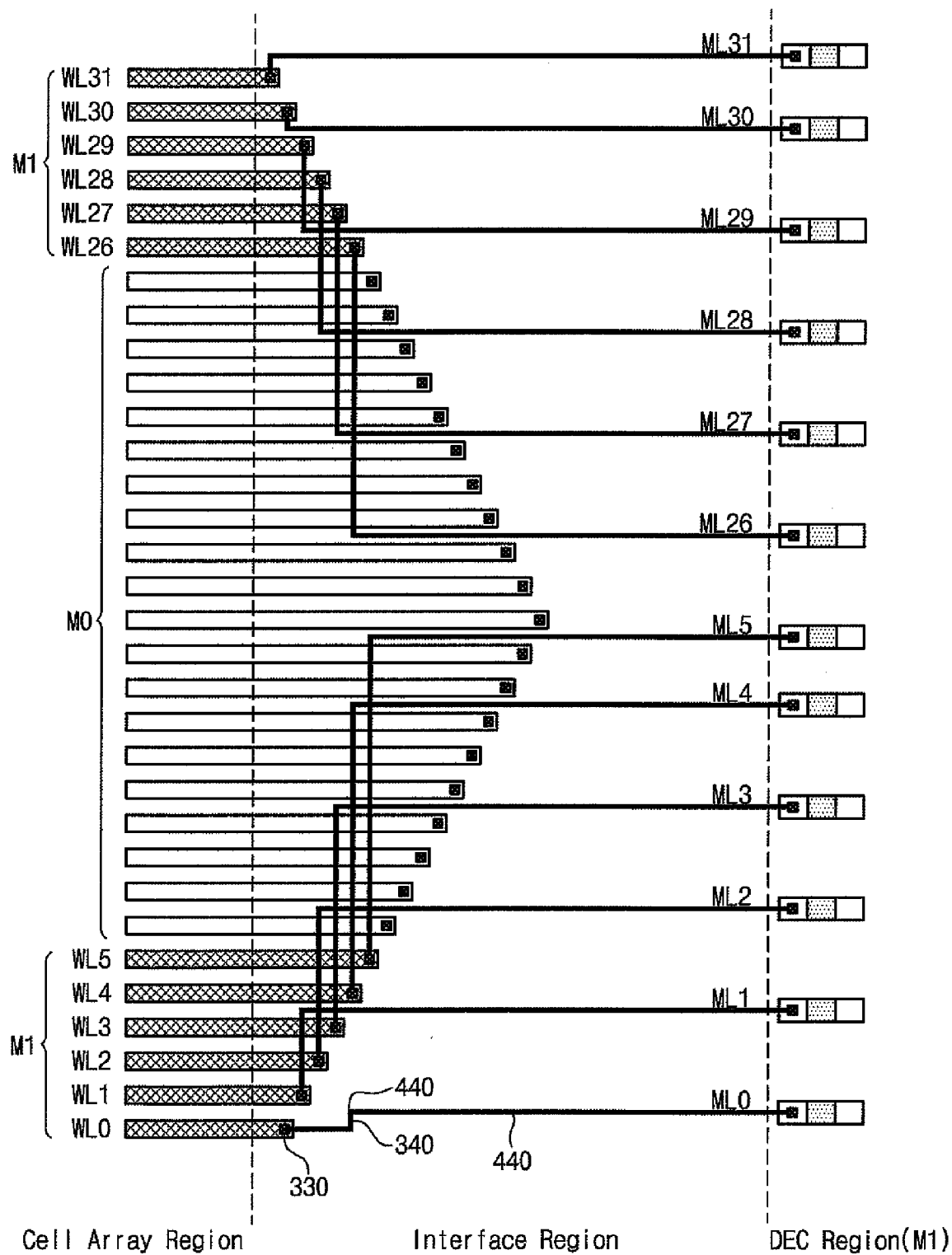

FIGS. 5A and 5B are diagrams illustrating positioning of the metal lines ML0 to ML31, according to another exemplary embodiment of the inventive concept.

FIGS. 5A and 5B illustrate wiring positions and connections which differ from those of FIGS. 3A and 3B. In FIGS. 5A and 5B, the word lines included in the first and second groups, the metal lines included among the first type metal lines M0 and the metal lines included among the second type metal lines M1 are different from those of FIGS. 3A and 3B, and the positioning of the word lines WL0 to WL31 disposed in the interface region is different from that of FIGS. 3A and 3B. Otherwise, the basic configurations shown in FIGS. 5A and 5B are the substantially the same as those shown in FIGS. 3A and 3B. Accordingly, the same reference numerals are given to the same elements, and the corresponding descriptions will not be repeated.

Referring to FIGS. 5A and 5B, word lines WL6 to WL25 are the word lines of the first group to be connected to the first type metal lines M0. In this case, metal lines indicated by ML6 to ML25 are included among the first type metal lines M0. Word lines WL0 to WL5 and WL26 to WL31 are the word lines of the second group to be connected to the second type metal lines M1. In this case, metal lines indicated by ML0 to ML5 and ML26 to ML31 are included among the second type metal lines M1. Furthermore, a signal line Sig may be wired between the metal lines ML6 to ML15 and the metal lines ML16 to ML25 (i.e., between the metal line ML15 and the metal line ML16, in particular).

FIG. 6 is a diagram three-dimensionally illustrating the configuration of the word lines WL6 and WL0 and corresponding metal lines ML6 and ML0 in FIGS. 5A and 5B.

Referring to FIGS. 5A, 5B and 6, the metal line ML6 is included among the first type metal lines M0, and the metal line ML0 is included among the second type metal lines M1. The word line WL6 is included among the word lines of the first group connected to the first type metal lines M0, and the word line WL0 is included among the word lines of the second group connected to the second type metal lines M1. The metal line ML6 included among the first type metal line M0 and the metal line ML0 included among the second type metal line M1 are formed at different layers. For example, the metal line ML6 may be formed at the upper portion of a first inter-layer dielectric, and the metal line ML0 may be formed at the upper portion of a second inter-layer dielectric. In FIG. 6, the first type metal line M0 is indicated by reference numeral 340, and the second type metal line M1 is indicated by reference numeral 440.

The first type metal line M0 340 is connected to the contact plug 330 that is at a certain position, and thereby connects a corresponding word line WL6 and the transistor (PT) of a corresponding row decoder. The contact plug 330 may be formed through the first inter-layer dielectric. The position of the first type metal line M0 340 and the position of the contact plug 330 corresponding to the first type metal line M0 340 may be matched with each other or crossed according to the number and distance of the first type metal lines M0 340 that are disposed at the upper portion of the first inter-layer dielectric. For example, when the position of each of the first type metal lines M0 340 and the position of the contact plug 330 corresponding to each of the first type metal lines M0 340 are matched, each of the first type metal lines M0 340 may be disposed in a straight-line in one direction at the upper portion of the first inter-layer dielectric. When the position of each of the first type metal lines M0 340 and the position of the contact plug 330 corresponding to each of the first type metal lines M0 340 are crossed, as illustrated in FIG. 6, each of the first type metal lines M0 340 may be formed in a shape that is bent from one direction to another direction.

One of the first type metal lines M0 340 is connected to the second type metal line M1 440 through a via 430 formed through the second inter-layer dielectric, and thus can be used as a middle metal line that connects the second type metal line M1 440 and the contact plug 330 which is formed through the first inter-layer dielectric. In this case, the first type metal line M0 340 may be wired at the upper portion of the first inter-layer dielectric in the same direction as that of the second type metal line M1 440 (for example, ML0), or may be wired in direction different from that of the second type metal line M1 440 (for example, a perpendicular direction).

Figure 7A:
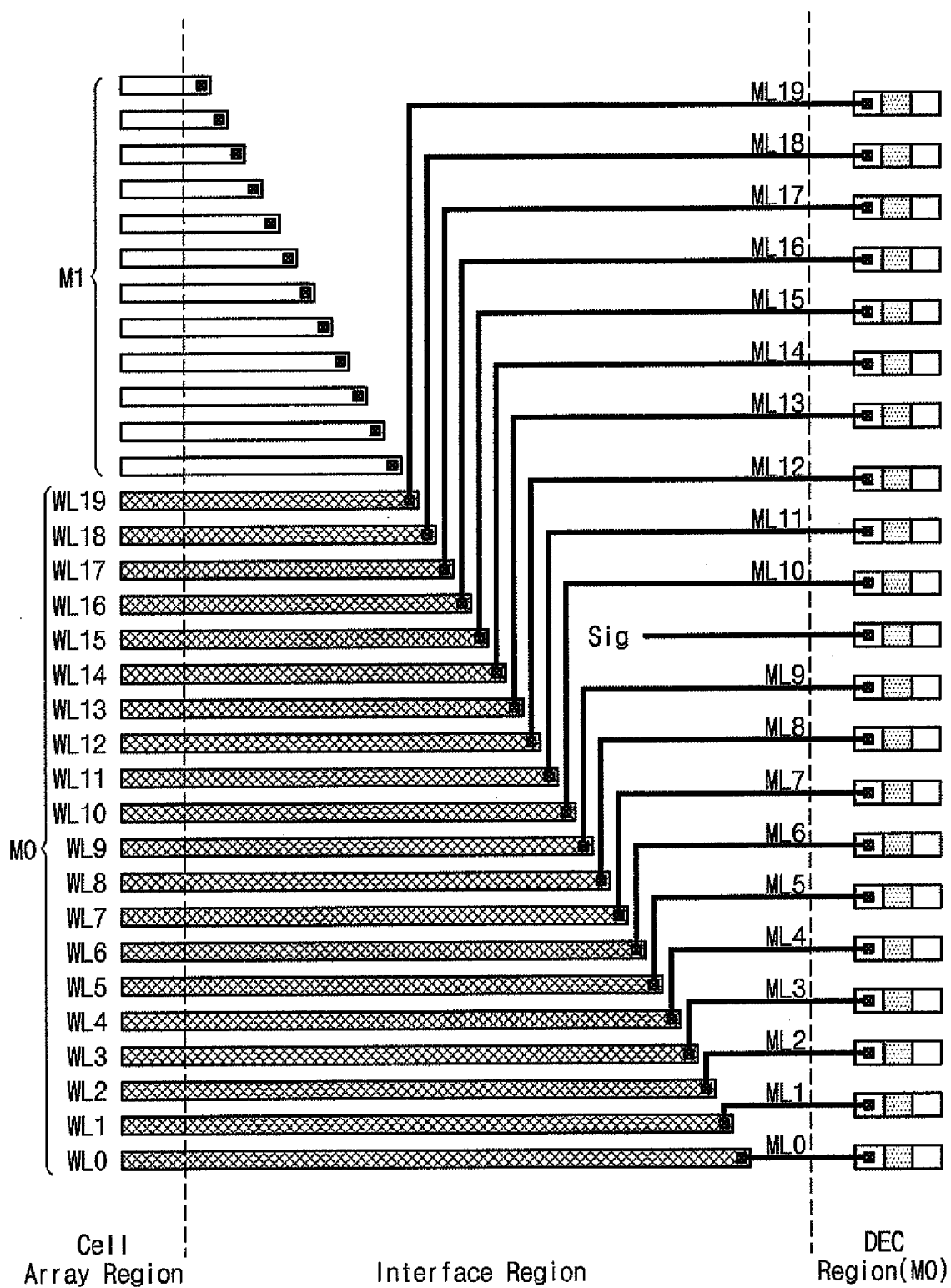
FIGS. 7A and 7B are diagrams illustrating positioning of different type metal lines, according to another exemplary embodiment of the inventive concept.
Figure 7B:
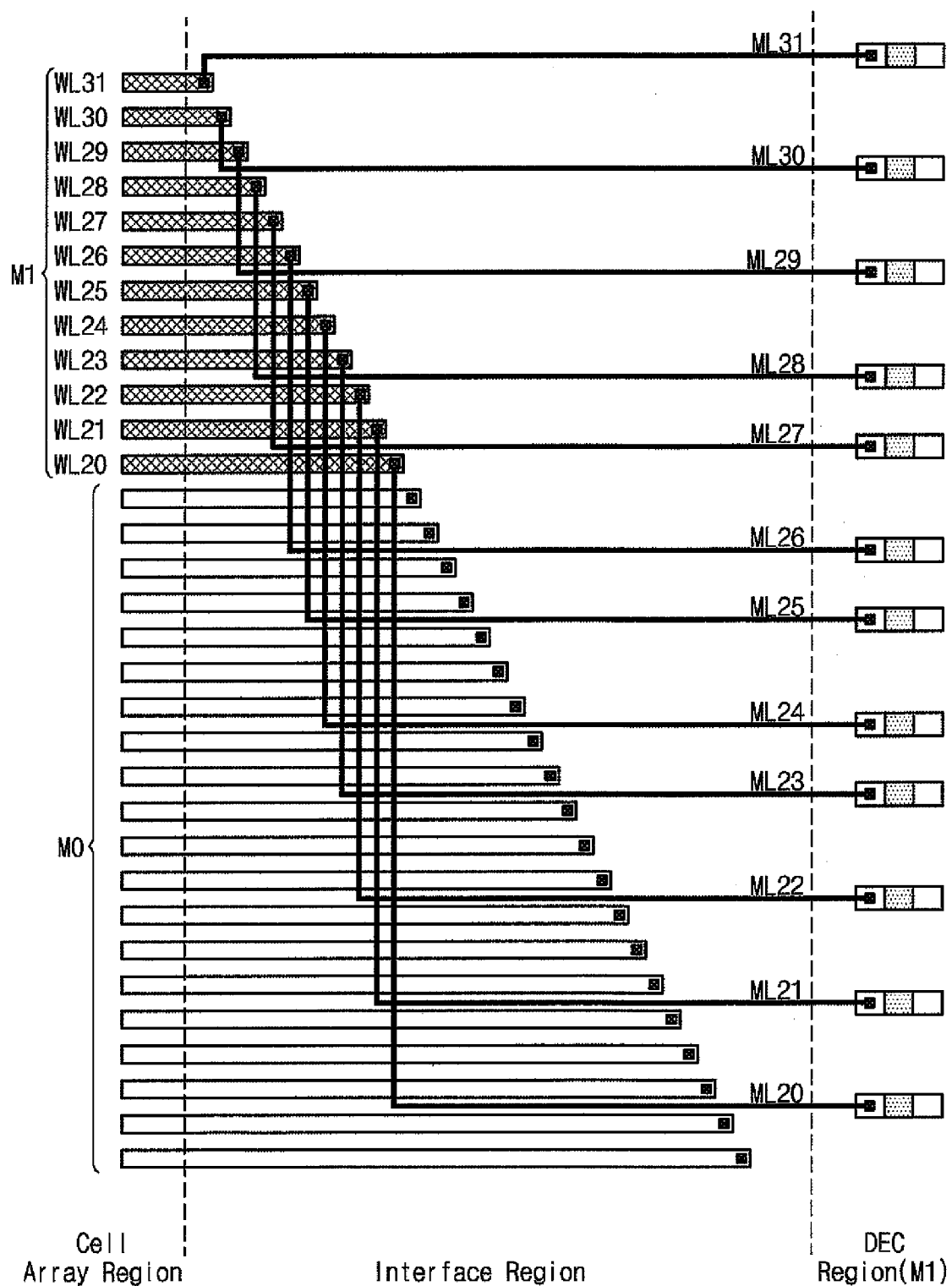

FIGS. 7A and 7B are diagrams illustrating positioning of metal lines ML0 to ML31 according to another exemplary embodiment of the inventive concept.

FIGS. 7A and 7B illustrate a wiring positioning and connections which differ from those of FIGS. 3A and 3B. In FIGS. 7A and 7B, the word lines included in the first and second groups, the metal lines included among the first type metal lines M0 and the metal lines included among the second type metal lines M1 are different from those of FIGS. 3A and 3B, and the positioning of the word lines WL0 to WL31 that are disposed in the interface region is different from that of FIGS. 3A and 3B. Otherwise, the basic configurations shown in FIGS. 7A and 7B are substantially the same as those shown in FIGS. 3A and 3B. Accordingly, the same reference numerals are given to the same elements, and corresponding descriptions will not be repeated.

Referring to FIGS. 7A and 7B, word lines WL0 to WL19 are included among the word lines of the first group to be connected to the first type metal lines M0. In this case, metal lines ML0 to ML19 are included among the first type metal lines M0. Word lines WL20 to WL31 are included among the word lines of the second group to be connected to the second type metal lines M1. In this case, metal lines ML20 to ML31 are included among the second type metal lines M1. Furthermore, a signal line Sig may be wired between the metal lines ML0 to ML9 and the metal lines ML10 to ML19 (i.e., between the metal line ML9 and the metal line ML10, in particular). The word lines WL0 to WL31 and the metal lines ML0 to ML31 in FIGS. 7A to 7B may be formed as shown in FIG. 6, for example, and the wiring type of each of the metal lines ML0 to ML31 may be variously changed and modified.

Figure 8:
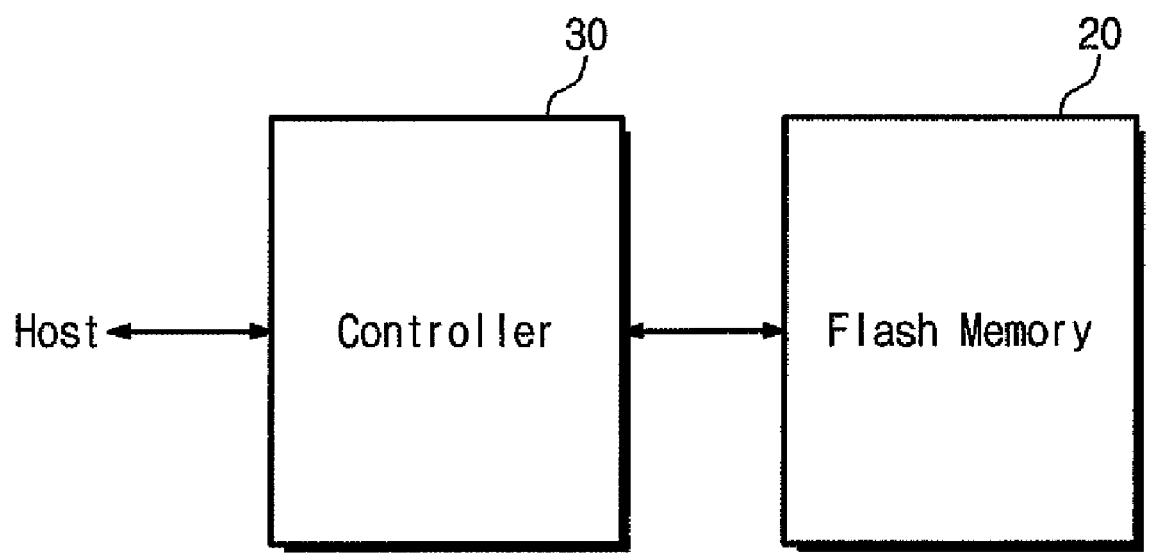
FIG. 8 is a block diagram schematically illustrating a memory system which includes the flash memory device, according to an exemplary embodiment of the inventive concept.

FIG. 8 is a block diagram schematically illustrating a memory system, which includes the flash memory device 20 in FIG. 1, according to an exemplary embodiment of the inventive concept.

Referring to FIG. 8, a memory system according to an exemplary embodiment includes the flash memory device 20 and a controller 30, which controls the flash memory device 20. The flash memory device 20 may be configured substantially the same as shown in FIG. 1. The configuration of the metal lines for connecting the word lines and row decoder of the flash memory device 20 may be substantially the same as one of the embodiments shown in FIG. 3A to FIG. 7B. Therefore, descriptions of these configurations will not be repeated.

The memory system in FIG. 8 may include a memory card, a memory card system and a Solid State Drive/Disk (SSD). In this case, the controller 30 may communicate with the outside (for example, a host) through any of a variety of interface protocols, such as Universal Serial Bus (USB), Multi Media Card (MMC) interface, PCIExpress (PIC-E) interface, Serial AT Attachment (SATA), Parallel AT Attachment (PATA), Small Computer System Interface (SCSI), Serial Attached SCSI (SAS) interface, Enhanced Small Disk Interface (ESDI) and Integrated Drive Electronics (ME) interface, and the like.

The flash memory device 20 may be a nonvolatile memory device that retains stored data even when a power is shut off. Thus, the flash memory device 20 may be used for a data storage and code storage, such that content is retained irrespective of the state of the power supply source. The flash memory device 20 may be applied to mobile devices such as cellular phones, Personal Digital Assistants (PDAs) digital cameras, portable game consoles and MP3P, and may also be applied to home applications, such as High Definition Television (HDTV), Digital Video Disk (DVD), routers and Global Positioning System (GPS).

Figure 9:
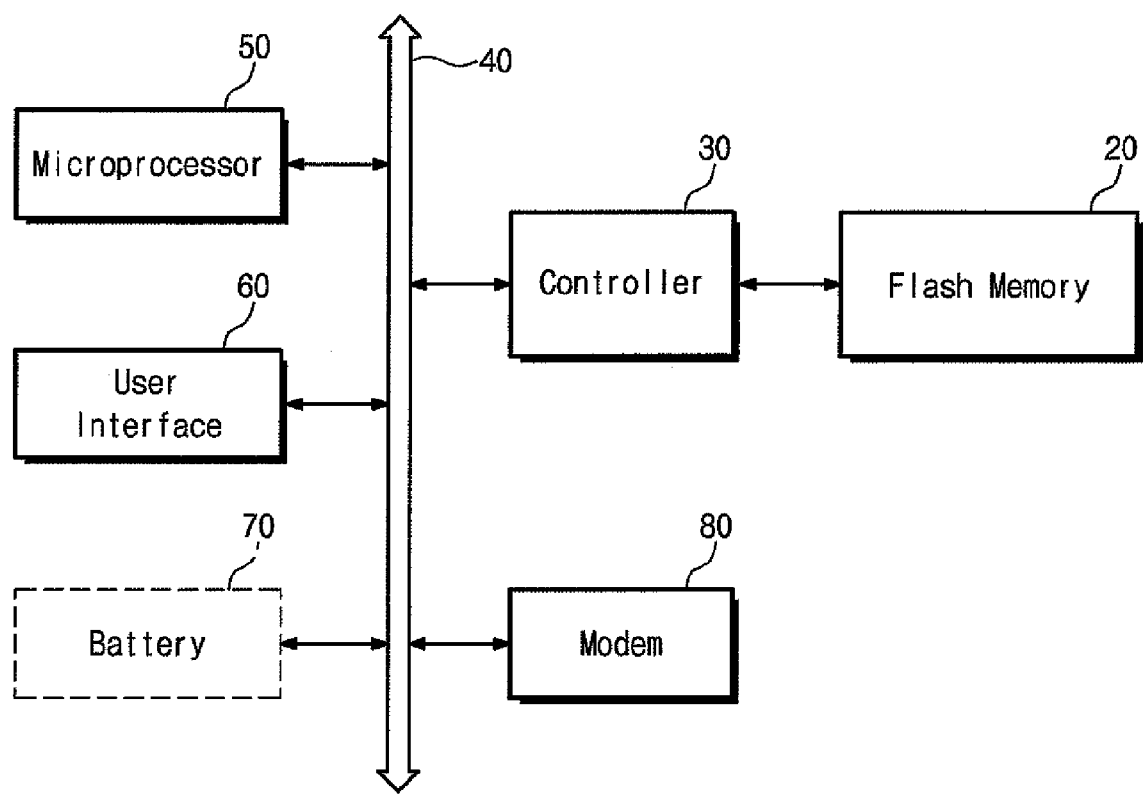
FIG. 9 is a block diagram schematically illustrating a computing system which includes the flash memory device, according to an exemplary embodiment of the inventive concept.

FIG. 9 is a block diagram schematically illustrating a computing system which includes the flash memory device 20, according to an exemplary embodiment of the inventive concept.

Referring to FIG. 9, a computing system according to an exemplary embodiment may include the flash memory device 20, the controller 30, a modem 80, such as a baseband chipset, a microprocessor 50 and a user interface 60, which are electrically connected via a bus 40. The flash memory device 20 may be configured substantially the same as shown in FIG. 1. The configuration of the metal lines connecting the word lines and row decoder of the flash memory device 20 may be substantially the same as one of the embodiments shown in FIG. 3A to FIG. 7B. Therefore, the corresponding descriptions will not be repeated.

When the computing system according to an exemplary embodiment of the inventive concept is a mobile device, a battery 70 for supplying the operation voltage of the computing system is also provided. Although not shown, an application chipset, a Camera Image Processor (CIP) and a mobile DRAM may be provided to the computing system according to an exemplary embodiment of the inventive concept. The controller 30 and the flash memory device 20, for example, may configure a memory card and/or a memory card system, and may configure an SSD, for example.

The flash memory device or the memory system according to embodiments of the inventive concept may be mounted as various types of packages. For example, the flash memory device or the memory system according to various embodiments concept may be packaged in a package type, such as Package on Package (POP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted. In exemplary embodiments of the inventive concept, memory cells may be implemented with any one of various cell structures having a charge trapping layer. As a cell structure having the charge trapping layer, a charge trap flash structure using a charge trapping layer, a stack flash structure in which arrays are stacked as a multi layer, a flash structure having no source-drain and a pin-type flash structure may be applied.

According to embodiments of the inventive concept, the metal lines for connecting the decoder with the word lines are dispersedly disposed in at least two layers in consideration of differences between voltages applied to adjacent word lines and the inter-layer characteristics of the metal lines. Accordingly, the metal lines occupy less area on the chip, and the voltage differences between the adjacent metal lines are reduced. As a result, even when the distance between the metal lines decreases, the nonvolatile memory device according to embodiments of the inventive concept effectively narrows the distance between the metal lines, independent of the level of a breakdown voltage.

The above-describe subject matter is to be considered illustrative, and not restrictive. While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A nonvolatile memory device, comprising:
   a memory cell array region comprising a plurality of word lines;
   a decoder supplying a plurality of voltages to the word lines through a plurality of first type metal lines formed of a first metal and a plurality of second type metal lines formed of a second metal; and
   an interface region connecting the first type metal lines to first word lines of the plurality of word lines in a first group, and connecting the second type metal lines to second word lines of the plurality of word lines in a second group,
   wherein the first type metal lines are sequentially disposed to correspond with a positioning order of the first word lines in the first group, and the second type metal lines are sequentially disposed to correspond with a positioning order of the second word lines in the second group.

2. The nonvolatile memory device of claim 1, wherein the decoder is disposed at one side of the memory cell array.

3. The nonvolatile memory device of claim 1, wherein:
   the first type metal lines are disposed to minimize a difference between voltages applied to adjacent word lines among the first word lines in the first group, and
   the second type metal lines are disposed to minimize a difference between voltages applied to adjacent word lines among the second word lines in the second group.

4. The nonvolatile memory device of claim 1, wherein the first word lines in the first group and the second word lines in the second group are sequentially disposed, respectively.

5. The nonvolatile memory device of claim 1, wherein the first type metal lines and the second type metal lines are formed at different layers.

6. The nonvolatile memory device of claim 1, wherein the number or separation distance of the first type metal lines and the number or separation distance of the second type metal lines are determined according to the physical characteristics of the first metal and second metal, respectively.

7. The nonvolatile memory device of claim 1, wherein the number of the first type metal lines differs from the number of the second type metal lines.

8. The nonvolatile memory device of claim 1, wherein each of the first type metal lines is disposed at an upper portion of a first inter-layer dielectric, and is connected to a corresponding first word line through a contact plug formed through the first inter-layer dielectric.

9. The nonvolatile memory device of claim 8, wherein each of the second type metal lines is disposed at an upper portion of a second inter-layer dielectric, and is connected to a corresponding middle metal line through a via formed through the second inter-layer dielectric, and
   wherein the middle metal line is connected to a corresponding second word line through a contact plug.

10. The nonvolatile memory device of claim 9, wherein the middle metal line is formed of the first metal at the upper portion of the first inter-layer dielectric.

* * * * *